(12) United States Patent
Krishnamoorthy et al.

(10) Patent No.: US 9,419,232 B2
(45) Date of Patent: Aug. 16, 2016

(54) NANOSTRUCTURED ORGANIC MATERIALS AND A PROCESS FOR THE PREPARATION THEREOF

(71) Applicant: Council of Scientific and Industrial Research, New Delhi (IN)

(72) Inventors: Kothandam Krishnamoorthy, Pune (IN); Arulraj Arulkashmir, Pune (IN); Bhan Prakash Jain, Pune (IN)

(73) Assignee: Council of Scientific and Industrial Research (IN)

( * ) Notice: Subject to any disclaimer, the term of this patent is extended or adjusted under 35 U.S.C. 154(b) by 100 days.

(21) Appl. No.: 14/398,611

(22) PCT Filed: May 6, 2013

(86) PCT No.: PCT/IN2013/000299
§ 371 (c)(1),
(2) Date: Nov. 3, 2014

(87) PCT Pub. No.: WO2013/164860
PCT Pub. Date: Nov. 7, 2013

(65) Prior Publication Data
US 2015/0125698 A1 May 7, 2015

(30) Foreign Application Priority Data
May 4, 2012 (IN) .......................... 1362/DEL/2012

(51) Int. Cl.
C09B 5/62 (2006.01)
H01L 51/00 (2006.01)
C09K 11/06 (2006.01)
H01L 51/05 (2006.01)

(52) U.S. Cl.
CPC .............. H01L 51/0092 (2013.01); C09B 5/62 (2013.01); C09K 11/06 (2013.01); H01L 51/0508 (2013.01); C09K 2211/1011 (2013.01); C09K 2211/188 (2013.01); H01L 51/0053 (2013.01); H01L 51/0558 (2013.01); Y10T 428/2982 (2015.01)

(58) Field of Classification Search
CPC ............ H01L 51/0092; H01L 51/0053; H01L 51/0558; H01L 51/0508; C09B 5/62; C09K 11/06; C09K 2211/1011; C09K 2211/188; Y10T 428/2982
USPC ....................... 428/402; 252/519.21
See application file for complete search history.

(56) References Cited

FOREIGN PATENT DOCUMENTS

| CN | 101949026 | 1/2011 |
| WO | WO-2013/164860 | 11/2013 |

OTHER PUBLICATIONS

Pradip K. Sukul et al: "Assemblies of perylene diimide derivatives . . ." Chemical Communications, vol. 47, No. 43, Jan. 1, 2011, p. 11858.*
Zhou Y et al: "A selective Off/On fluorescent sensor . . .", Bioorganic & Medicinal Chemistry Letters, Pergamon,Elsevier Science, GB, vol. 20, No. 1, Jan. 1, 2010, pp. 125-128.*
Li N et al: "Salicylaldehyde hydrazones as fluorescent probes . . ." Talanta, Elsevier, Amsterdam, NI, vol. 79, No. 2, Jul. 15, 2009, pp. 327-332.*
"International Application No. PCT/IN2013/000299, Article 19 amendment filed Sep. 26, 2013", (Sep. 26, 2013), 11 pgs.
"International Application No. PCT/IN2013/000299, International Search Report mailed Aug. 6, 2013", (Aug. 6, 2013), 4 pgs.
"International Application No. PCT/IN2013/000299, International Preliminary Report on Patenability dated Nov. 4, 2014", 7 pgs.
"International Application No. PCT/IN2013/000299, Written Opinion mailed Aug. 6, 2013", 6 pgs.
Chen, Xiaoqiamg, et al., "An "Off-On" Type UTP/UDP Selective Fluorescent Probe and Its Application to Monitor Glycosylation Process", *Organic Letters* (11)(10), (2009), 2181-2184.
Dobrawa, Rainer, et al., "Fluorescent Supramolecular Polymers: Metal Directed Self-Assembly of Perylene Bisimide Building Blocks", *Macromolecules*, 38(4), (2005), 1315-1325.
Gao, Bo, et al., "Self-assembly of Perylene Bisimide Bridging Ligands to Zinc Phthalocyanine in Solution", *Supramolecular Chemistry*, 19(3), (2007), 207-210.
Gong, Zhong-Liang, et al., "Novel pyrazoline-based selective fluorescent sensor for Zn2+ in aqueous media", *Sensors and Actuators B: Chemical*, 159(1), (2011), 148-153.
Huang, Chun, et al., "Perylene-3,4,9,10-tetracarboxylic Acid Diimides: Synthesis, Physical Properties, and Use in Organic Electronics", *J. Org. Chem.*, 76(8), (2011), 2386-2407.
Li, Na, et al., "Salicylaldehyde hydrazones as fluorescent probes for zinc ion in aqueous solution of physiological pH", *Talanta*, 79(2), (2009), 327-332.
Schmidt, Rüdiger, et al., "High-Performance Air-Stable n-Channel Organic Thin Film Transistors Based on Halogenated Perylene Bisimide Semiconductors", *J. Am. Chem. Soc.*, 131(17), (2009), 6215.6228.
Sukul, Pradip K., et al., "Assemblies of perylene diimide derivatives with melamine into luminescent hydrogels", *Chem. Commun.,*, 47(43), (2011), 11858-11860.

(Continued)

*Primary Examiner* — Leszek Kiliman
(74) *Attorney, Agent, or Firm* — Schwegman, Lundberg & Woessner, P.A.

(57) ABSTRACT

The invention disclosed nanostructured organic materials and a process for the preparation thereof. Further the present invention herein provides nanostructured organic material comprising divalent zinc metal complex of N,N'-Di-(phenyl-3,5 dicarboxylic acid)-perylene-3,4,9,10-tetracarboxylic acid diimide doped with hydrazine hydrate, which exhibits increased charge carrier mobility at low operating voltage at atmospheric condition useful in organic field effect transistors (OFETs).

9 Claims, 8 Drawing Sheets

(56) References Cited

OTHER PUBLICATIONS

Susarova, Diane K., "Donor-acceptor complex formation in evaporated small molecular organic photovoltaic cells", *Solar Energy Materials & Solar Cells*, 94, (2010), 803-811.

Wei, Peng, et al., "2-(2-Methoxyphenyl)-1,3-dimethyl-1H-benzoimidazol-3-ium Iodide as a New Air-Stable n-Type Dopant for Vacuum-Processed Organic Semiconductor Thin Films", *J. Am. Chem. Soc.*, 134(9), (2012), 3999-4002.

Wei, Peng, et al., "Use of a 1H-Benzoimidazole Derivative as an n-Type Dopant and to Enable Air-Stable Solution-Processed n-Channel Organic Thin-Film Transistors", *J. Am. Chem. Soc.*, 132(26), (2010), 8852-8853.

Weissman, Haim, et al., "Palladium Complexes of Perylene Diimides: Strong Fluorescence.Despite Direct Attachment of Late Transition Metals to Organic Dyes", *Inorg Chem.*, 46(12), (2007), 4790-4792.

Zhao, Yingie, et al., "Zinc(II)-selective ratiometric fluorescent probe based on perylene bisimide derivative", *Luminescence*, 26(3), (2011), 214-217.

Zhou, Ying, et al., "A selective 'Off-On' fluorescent sensor for $Zn^{2+}$ based on hydrazone—pyrene derivative and its application for imaging of intracellular $Zn^{2+}$", *Bioorganic & Medicinal Chemistry Letters*, 20(1), (2010), 125-128.

\* cited by examiner $V_T = -0.1 \text{ V}$

NANOSTRUCTURED ORGANIC MATERIALS AND A PROCESS FOR THE PREPARATION THEREOF

PRIORITY CLAIM TO RELATED APPLICATIONS

This application is a U.S. national stage application filed under 35 U.S.C. §371 from International Application Serial No. PCT/IN2013/000299, which was filed May 6, 2013, and published as WO 2013/164860 on Nov. 7, 2013, and which claims priority to India Application No. 1362/DEL/2012, filed May 4, 2012, which applications and publication are incorporated by reference as if reproduced herein and made a part hereof in their entirety, and the benefit of priority of each of which is claimed herein.

TECHNICAL FIELD OF THE INVENTION

The present invention provides nanostructured organic materials and a process for the preparation thereof. Particularly, the present invention provides a nanostructured organic material comprising conjugated molecules with at least two functional groups binding with a multivalent metal and their use in improved device performance.

More particularly, the invention relates to nanostructured organic material comprising divalent zinc metal complex of N,N'-Di-(phenyl-3,5 dicarboxylic acid)-perylene-3,4,9,10-tetracarboxylic acid diimide doped with hydrazine hydrate exhibiting increased charge carrier mobility at low operating voltage at atmospheric condition useful in organic field effect transistors (OFETs).

BACKGROUND AND PRIOR ART

Molecular doping of organic semiconductors by either strong electron donors or acceptors has been demonstrated to provide advantages in thin film devices. The addition of dopants can increase the hole or electron density depending on their nature and modulate the Fermi level (EF).

Inorganic materials such as silicon are generally used for charge transport applications. Organic materials, particularly polymers are being studied for these applications for some time now.

Semiconducting polymers are poised to transform the scenario of today's electronics and display technology. Intensive research in the last two decades has been stimulated by the prospect for low-cost fabrication of devices with reasonable stability and performance. Although the field of semiconducting and conducting polymers has generated a huge amount of literature, the potential for conduction in polymeric materials itself remained unrecognized for a long time.

Further in thin film devices, n-type doping has been found to increase the charge carrier mobility and improve the air stability of the device. To donate electrons to an organic semiconductor, the dopant must have highest occupied molecular orbital (HOMO) level above the lowest unoccupied molecular orbital (LUMO) of the semiconductor. Such a HOMO energy level is vulnerable for oxidation due to low lying oxygen energy level (−5.2 eV). This complicates the device fabrication process and limits the use of dopants in organic filed effect transistors (OFETs). Use of dopants such as tetrathianaphthazene with low ionization energy has been attempted. However, they are not strong enough dopants to appreciably increase the charge carrier mobility of the semiconductors. Cationic salt precursors such as crystal violet and pyronin B have also been used as dopants. Another approach is the use of organometallic sandwich dimers as n type dopant. The dimer cleaves into monomer radicals upon heating, which inject electrons into the semiconductor resulting in n type doping. Recently, Peng Wei et al. in J. Am. Chem. Soc., 2010, 132 (26), pp 8852-8853 have employed neutral radical forming (4-(1,3-dimethyl-2,3-dihydro-1H-benzoimidazol-2-yl)phenyl)dimethylamine (N-DMBI) to n dope [6,6]-phenyl C61 butyric acid methyl ester (PCBM). The n doping increased the conductivity of the PCBM by four orders. More recently, Peng Wei et al. in J. Am. Chem. Soc., 2012, 134 (9), pp 3999-4002 describes the cationic analogue of N-DMBI, to increase the conductivity of fullerene $C_{60}$ to 5.5 S/cm. However, said dopant didn't improve the field induced charge carrier mobility of $C_{60}$.

Perylene-3,4,9,10-tetracarboxylic acid diimides (perylene diimides, PDIs) or Perylenebisimides (PBIs) are well known n type materials, which provide myriad of opportunities for installing functional moieties. The self-assembly, electronic and optical properties of PBIs can be modulated by functionalization at imide nitrogen.

Recently, the applications for PDI or PBI derivatives have emerged in areas including organic electronics like organic photovoltaic devices and field-effect transistors. Therefore the synthesis and physical properties of PDI derivatives become more important.

There are ample literature which describe the PDI or PBI derivatives, for example Pradip K. Sukul et al. in *Chem. Commun.*, 2011, 47, 11858-11860 reported unique and spontaneous formation of hydrogels of perylene derivatives with melamine further, this article provides synthesis of N,N'-Di-(phenyl-3,5-dicarboxylic acid)-perylene-3,4:9,10-tetracarboxylic acid diimide (PI) from perylene-3,4:9,10-tetracarboxylic dianhydride, 5-aminoisophthalic acid and imidazole (85% yield).

Bo Gaoa et al. in supramolecular chemistry 19, (3), 2007 pg. 207-210 discloses supramolecular self-assembly, where a pyridyl-substituted perylene bisimide dye (DPyPBI) axially binds to zinc phthalocyanine (ZnPc). Additionally Zinc (II)-selective ratiometric fluorescent probe based on perylene bisimide derivative is reported in Luminescence. 2011 May-June; 26(3):214-7.Epub 2010 by Zhao Y et al. The palladium complexes of perylene diimides (PDI) is reported in Inorg Chem. 2007 Jun. 11; 46(12):4790-2. Epub 2007 May 16 by Weissman H, et al.

Further donor-acceptor complex formation in evaporated small molecular organic photovoltaic cells is reported by Diana K. Susarova in *Solar Energy Materials & Solar Cells* 94 (2010) 803-811 wherein perylene diimide Py-PDI and naphthalene diimide Py-NDI possessing chelating pyridyl groups form self-assembled coordination complexes with ZnPc in solution and co-evaporated solid blends. Further it discloses perylene-3,4,9,10-tetracarboxylic acid dianhydride was mixed with freshly distilled quinoline, 3-picolylamine and $Zn(OAc)_2.H_2O$.

Synthesis, physical properties, and use of perylene-3,4,9, 10-tetracarboxylic acid diimides is demonstrated by Chun Huang in organic electronics, in J. Org. Chem., 2011, 76 (8), pp 2386-2407. Also CN101949026 relates to a method for preparing a perylene polyimide derivative film useful in the field of photoelectric materials.

In view of foregoing, there is still a need to develop 'radical containing PBIs based devices' that works at low operating voltages with high charge carrier mobility, which would be a step forward in the direction of commercial exploitation of OFETs.

OBJECTIVE OF THE INVENTION

The main objective of the invention is to provide a nanostructured organic materials and a process for the preparation thereof Another objective of the present invention is to provide organic material comprising conjugated molecules with at least two functional groups that can bind with a multivalent metal, further doped with hydrazine to fabricate a OFET devices that works at atmospheric condition, at very low operating voltage with very high charge mobility and very low threshold voltage.

SUMMARY OF THE INVENTION

Accordingly, the present invention provides a nanostructured organic material comprising hydrazine doped zinc (H) complex of N,N'-Di-(phenyl-3,5 dicarboxylic acid)-perylene-3,4,9,10-tetracarboxylic acid diimide, which exhibits improved device efficiency at atmospheric condition, useful for application in organic field effect transistors (OFETs).

In an embodiment of the present invention the improved device efficiency comprising of charge mobility, operating voltage, threshold voltage and sub threshold slope.

In one embodiment of the present invention the charge is selected from the group consisting of electron and hole.

In another embodiment of the present invention the charge mobility is as high as 13 cm$^2$/Vs.

In yet another embodiment of the present invention the operating voltage is as low as 1 V.

In yet another embodiment of the present invention the threshold voltage is as low as −0.1 V.

In yet another embodiment of the present invention the sub threshold slope is as low as 0.16 V/dec.

In yet another embodiment of the present invention the nanostructure having diameter in the range of 70 and 100 nm.

In yet another embodiment of the present invention the device is organic field effect transistors (OFETs).

In yet another embodiment of the present invention is disclosed a process for the preparation of nanostructured organic material, comprising steps of
  a) reacting 3,4,9,10 perylene tetracarboxylic dianhydride with 5-amino isophthalic acid in presence of imidazole and zinc acetate at temperature range 130° C. to 160° C. for a period in the range of 15-50 hrs under argon atmosphere;
  b) precipitating the mixture of step a) in presence of 2N HCl, followed by washing with solvent selected from the group consisting of water, methanol, ethanol, propanol, isopropanol, butanol, DMF, anhydrous chloroform either alone or combination thereof and drying to obtain N,N'-Di-(phenyl-3,5 dicarboxylic acid)-perylene-3,4,9,10-tetracarboxylic acid diimide (PTCDI-TC);
  c) dissolving zinc nitrate hexahydrate and (PTCDI-TC) as obtained in step (b) in a mixture of DMF/1,4-dioxane/H$_2$O in the ratio ranging between 1:1:1 to 3:1:1 followed by heating at temperature in the range of 100-150° C. for a period in the range of 2-6 days and subsequently cooling and washing with solvent selected from the group consisting of water, methanol, ethanol, propanol, isopropanol, butanol, DMF, anhydrous chloroform either alone or combination thereof to obtain Zn complex of PTCDI-TC; and
  d) dopping the Zn complex of PTCDI-TC as obtained in step (c) with hydrazine hydrate at a temperature in the range of 100°-180° C. ° C. for a period in the range of 30-250 min.

In an aspect the invention provides nanostructured organic material comprising of divalent metal complex of N,N'-Di-(phenyl-3,5-dicarboxylic acid)-perylene-3,4:9,10-tetracarboxylic acid diimide (PI) doped with hydrazine hydrate exhibits improved device efficiency at atmospheric condition, useful for application in organic field effect transistors (OFETs). This is largely due to the formation of air stable radical anion. The Hydrazine doping injects electrons to the highest occupied molecular orbital of 1 and 2, contrary to the demonstrated electron injection to lowest unoccupied molecular orbital. This approach enhances the air stability of the device. Further, it also decreases the operating voltage of the OFETs.

In an another aspect, the invention provides process for synthesis of divalent metal complex of N,N'-Di-(phenyl-3,5-dicarboxylic acid)-perylene-3,4:9,10-tetracarboxylic acid diimide (PI), doped with hydrazine hydrate.

Further, the invention pertains to characterization of synthesized compounds (1), (2) and hydrazine doped (2) and the application of the same in OFET device.

In a preferred embodiment, the invention provides a nanostructured organic material comprising divalent metal complex of PBI derivatives doped with hydrazine which exhibits improved device efficiency at atmospheric condition, useful for application in organic field effect transistors (OFETs); wherein 'PBI derivative' is N,N'-Di-(phenyl-3,5 dicarboxylic acid)-perylene-3,4,9,10-tetracarboxylic acid diimide and divalent metal is Zn(II).

In the invention, the phrases 'nanostructured conjugated molecules with at least two functional groups' is an organic semiconductor preferably, 'N,N'-Di-(phenyl-3,5-dicarboxylic acid)-perylene-3,4,9,10-tetracarboxylic acid diimide', (1), or 'carboxylic acid derivatives of Perylene bis-imides (PBIs)' or "PBI derivatives" or 'carboxylic acid derivatives of perylene di-imides PDIs' or 'perylene-3,4,9,10-tetracarboxyl di-imide-tetracarboxyllic acid' (PTCDI-TC) as referred herein in the entire specification are used interchangeably and hence the person skilled in the art will appreciate the same as such.

Figure 1:
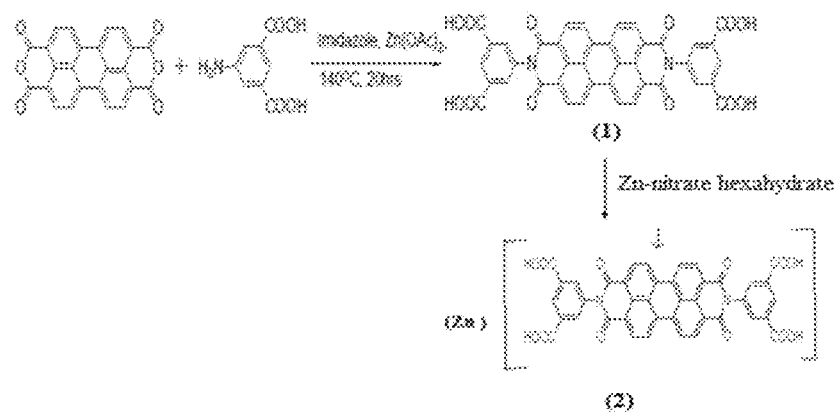
FIG. 1 depicts scheme for synthesis of conjugated molecule with multiple functional groups, especially carboxylic acid derivative of PBI 1 and Zn metal complex of PBI carboxylic acid derivative 2.

In an embodiment, PBI with four carboxylic acid functionalities, was designed and synthesized as shown in (FIG. 1). These molecules spontaneously form nanowires, but they disintegrate into small assemblies upon addition of hydrazine, presumably due to the electrostatic repulsion between the negative charges generated by the n-doping. In order to impart structural integrity to the assembly, the carboxylic acid functionalities were reacted with multivalent metal particularly divalent metal, which connects the individual PBI derivative (1) and result in the formation of (2') (metal organic system comprising zinc and PBI derivative). (cf scheme 1)

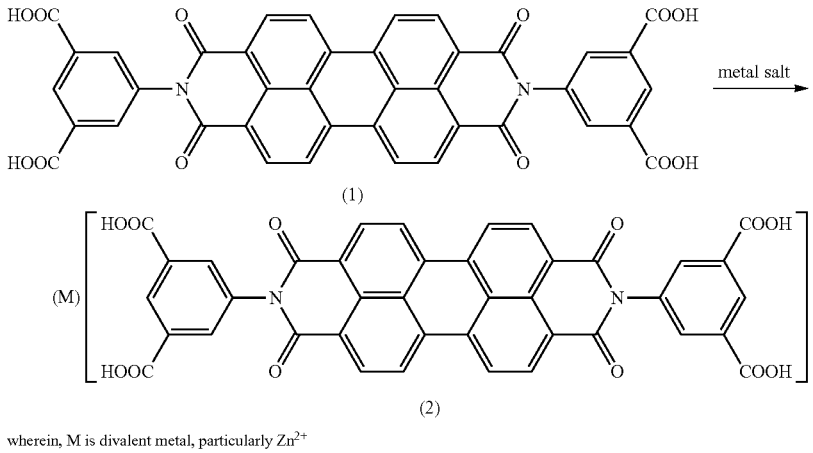

Scheme 1:

(1)

(2)

wherein, M is divalent metal, particularly Zn$^{2+}$

ABBREVIATIONS (PTCDI-TC): perylene-3,4,9,10-tetracarboxyl di-imide tetracarboxyllic acid

DETAILED DESCRIPTION OF INVENTION

The invention will now be described in detail in connection with certain preferred and optional embodiments, so that various aspects thereof may be more fully understood and appreciated.

In accordance with the above, the present invention provides nanostructured organic material comprising divalent metal complex of conjugated molecules with at least two functional groups doped with hydrazine with the objective of modulating E$_F$ and charge carrier mobility.

The zinc complex of PBI derivative according to the invention increases the charge carrier mobility when doped with hydrazine hydrate to obtain hydrazine doped zinc complex of PBI derivative. The hydrazine doped zinc complex of PBI derivative (2) when used in OFETs shows high electron carrier mobility (µ) and low threshold voltage (VT) and sub threshold slope (S) at atmospheric condition.

In a preferred embodiment, the invention provides nanostructured organic material comprising of divalent metal complex of PBI derivative.

In a preferred the embodiment the divalent or multivalent metal is Zinc (II), which form complex with a PBI derivative i.e. N,N'-Di-(phenyl-3,5-dicarboxylic acid)-perylene-3,4:9, 10-tetracarboxylic acid diimide (PI)(1). The suitable metal source for the preparation of divalent metal complex of PBI derivative (2) is metal salt, preferably hydrates of Zinc nitrate.

In another preferred embodiment, the invention provides process for the preparation of nanostructured organic material comprising divalent metal complex of conjugated molecules with at least two functional groups i.e. metal coordinated assembled structure (2).

Particularly, the invention pertains to process for the preparation of zinc complex of N,N'-Di-(phenyl-3,5-dicarboxylic acid)-perylene-3,4,9,10-tetracarboxylic acid diimide, 2 which comprises the following steps;
a) reacting 3,4,9,10 perylene tetracarboxylic dianhydride with 5-amino isophthalic acid in presence of imidazole and zinc acetate at temperature range 130° C. to 160° C. under argon atmosphere;
b) precipitating the mixture of step a) in presence of 2N HCl, followed by washing and drying to obtain N,N'-Di-(phenyl-3,5 dicarboxylic acid)-perylene-3,4,9,10-tetracarboxylic acid diimide (PTCDI-TC) (1);
c) dissolving zinc nitrate hexahydrate and (PTCDI-TC) in a mixture of DMF/1,4-dioxane/H2O in Teflon liner, subsequently heating at about 100° C., cooling and washing to afford microcrystalline material i.e. Zn complex of PTCDI-TC (2) and
d) doping the Zn complex of PTCDI-TC (2) with hydrazine hydrate, followed by heating at 150° C.

In the process, the washing is carried out in presence of solvent selected from the group consisting of water, methanol, ethanol, propanol, isopropanol, butanol, DMF, anhydrous chloroform either alone or combination thereof. Preferably the washing of (PTCDI-TC) (1) is carried out in presence of aqueous lower alcohol such as methanol, ethanol, propanol, isopropanol, butanol, whereas the washing of Zn complex of PTCDI-TC (2) is performed in presence of DMF, anhydrous chloroform, methanol. Further drying temperature is about 100° C. The solvent used for dissolving comprises a mixture of DMF/1,4-dioxane/H2O is in the ratio of 1:1:1 to 3:1:1. The Zn complex of PTCDI-TC (2) doped with hydrazine hydrate used in fabricated device that is subjected for I-V measurements.

Figure 2:
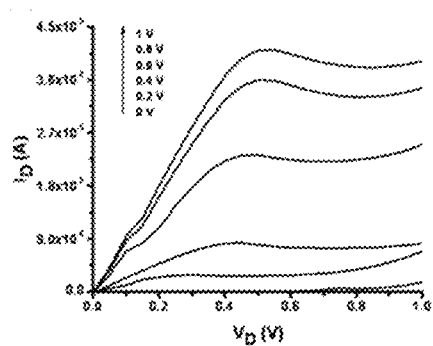
FIG. 2 depicts output characteristic IV curve showing the device working at low operating voltage with high mobility.
Figure 3:
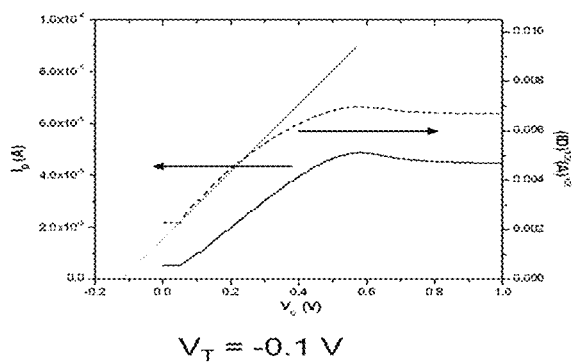
FIG. 3 depicts transfer characteristic IV curve showing the device working at very low threshold voltage.

Further the microcrystalline product i.e. zinc complex of PBI derivative (2) of the invention is dropped on top of field effect transistors to measure the mobility. The output transfer characteristics are shown in FIG. 2. The transfer characteristics are shown in FIG. 3.

The zinc complex of PBI derivative (2) doped with hydrazine shows high electron carrier mobility ($\mu$) and low threshold voltage ($V_T$) and sub threshold slope (S) at atmospheric condition.

The zinc complex of PBI derivative (2) doped with hydrazine useful in OFET devices which operates at voltage as low as 1V with the electron carrier mobility ($\mu$) as high as 13.5 cm2/Vs, threshold voltage as low as −0.1V and sub threshold slope as low as −0.16 V/dec.

Also the inventors evaluated the effect of hydrazine doping on the frontier orbital energy levels of 1 and 2, wherein the environmentally stable dopant i.e hydrazine injects electrons to the partially filled HOMO energy levels of zinc complex of PBI derivative (2) to generate destabilised energy levels and radical anions. These radical anions based devices exhibit excellent field effect transistor device metrics. Such materials are capable of increase in the transport of electron as well, as hole in conjugated molecules.

The invention further provides characterization of N,N'-Di-(phenyl-3,5-dicarboxylic acid)-perylene-3,4,9,10-tetracarboxylic acid diimide, 1, Zn metal complex of PBI derivatives 2 and hydrazine doped 2 as discussed below.

Figure 9:
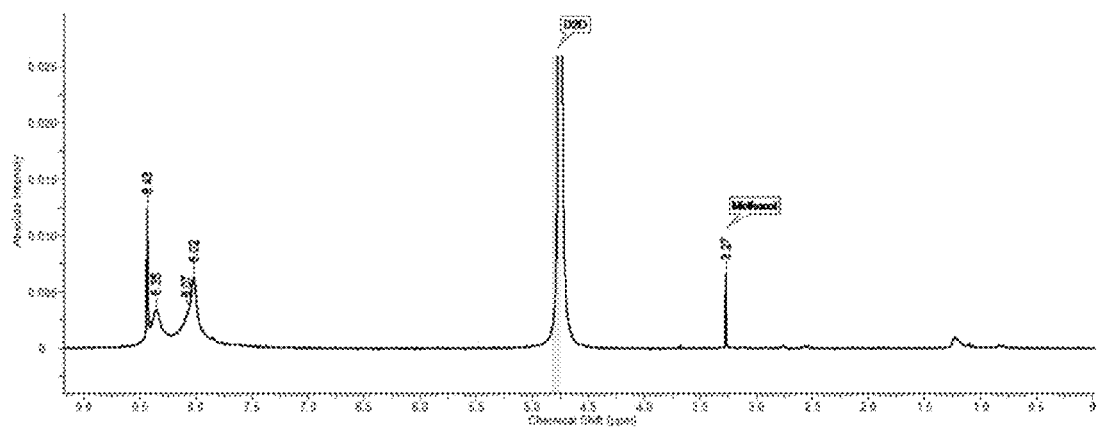
FIG. 9 depicts $^1$H NMR (400 MHz, D$_2$O) Spectrum of compound 1.
Figure 10:
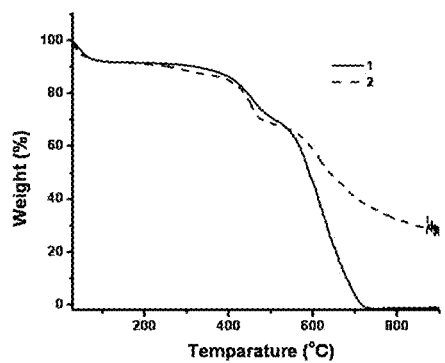
FIG. 10 depicts Fourier transform Infrared (FT-IR) spectrum of compound 1.

The formation of 1 was confirmed by NMR and IR spectroscopies (cf FIGS. 9 and 10).

Thermogravimetric Analysis

Figure 11:
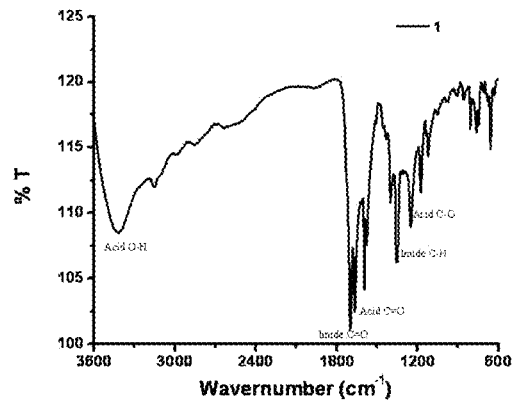
FIG. 11 depicts Thermo gravimetric curve for 1 and 2.

Thermal characteristics of 1 were studied by thermogravimetric analysis. About 5% weight loss was observed at 90° C. indicating the removal of water from the sample. Significant weight loss was observed at 400° C. revealing the initiation of thermal degradation of 1 with complete weight loss at 700° C. (cf FIG. 11).

Then, compound 2 was subjected to thermogravimetric analysis to study its thermal stability as well as degradation properties. At 90° C., a weight loss of 5% was observed which is likely due to the removal of water. The degradation of the organic molecules started at 400° C. and complete degradation didn't occur even at 900° C., which is due to the presence of zinc (cf, FIG. 11). It was observed that 100% weight loss occurred at 700° C. in case of 1, which was devoid of metal ions.

UV-Vis Absorption Spectroscopy Study

Figure 4:
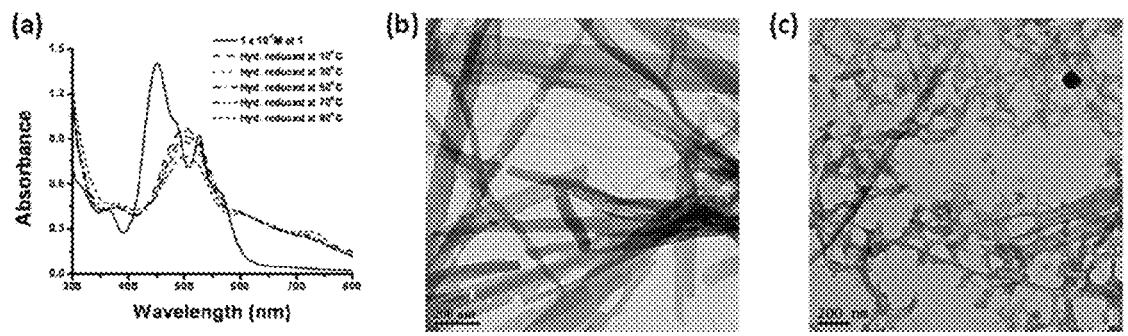
FIG. 4 depicts a) UV-vis absorption spectra of 1 as a function of temperature in presence of hydrazine, b) TEM image of 1 before hydrazine addition, and c) after hydrazine addition.
Figure 12:
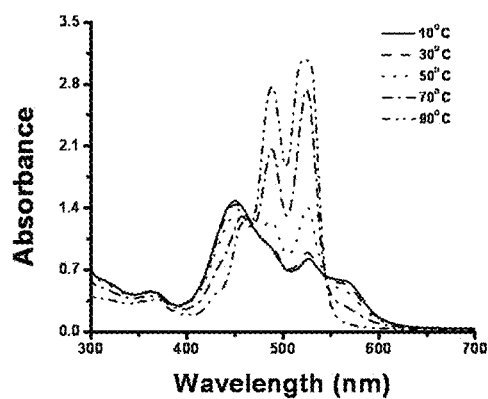
FIG. 12 depicts UV-visible absorption spectra of compound 1 as a function of temperature.
Figure 13:
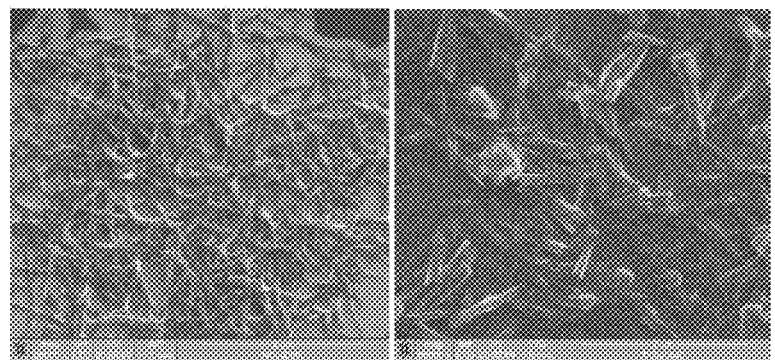
FIG. 13 depicts Scanning Electron Microscopic (SEM) images of 1 before (a) and after (b) hydrazine reduction.

The absorption and self-assembly characteristics of 1 were studied by UV-vis absorption spectroscopy. The UV-vis absorption spectrum of 1 dissolved in DMF shows three peaks at 458, 490 and 525 nm. These features correspond to H type aggregates of PBIs in solution. The hydrogen bonds involving imides and carboxylic acids of 1 are likely to be affected as a function of temperature. Thus, a solution of 1 was gradually heated from 0 to 100° C. and the absorption spectra were recorded. Upon increase in temperature, the intensity of the peak at 458 nm decreases with concurrent increase in the peak intensity at 490 and 525 nm (cf FIG. 12). This indicates the disassembly of H type aggregates further hydrazine was used as dopant to produce radical anions in 1 and use it in OFET fabrication. Further the impact of hydrazine reduction on the aggregation properties of 1 was evaluated by the inventors where upon heating 1 from 0 to 100° C. in presence of hydrazine, three broad peaks evolve at 502, 620 and 720 nm. The former peaks are attributed to change in the type of aggregates from H to J] and the latter is attributed to the formation of radical anion (FIG. 4a). The evolution and existence of the peak at 720 nm in atmospheric condition indicates the formation of stable radical anion in presence of oxygen and moisture.

Figure 5:
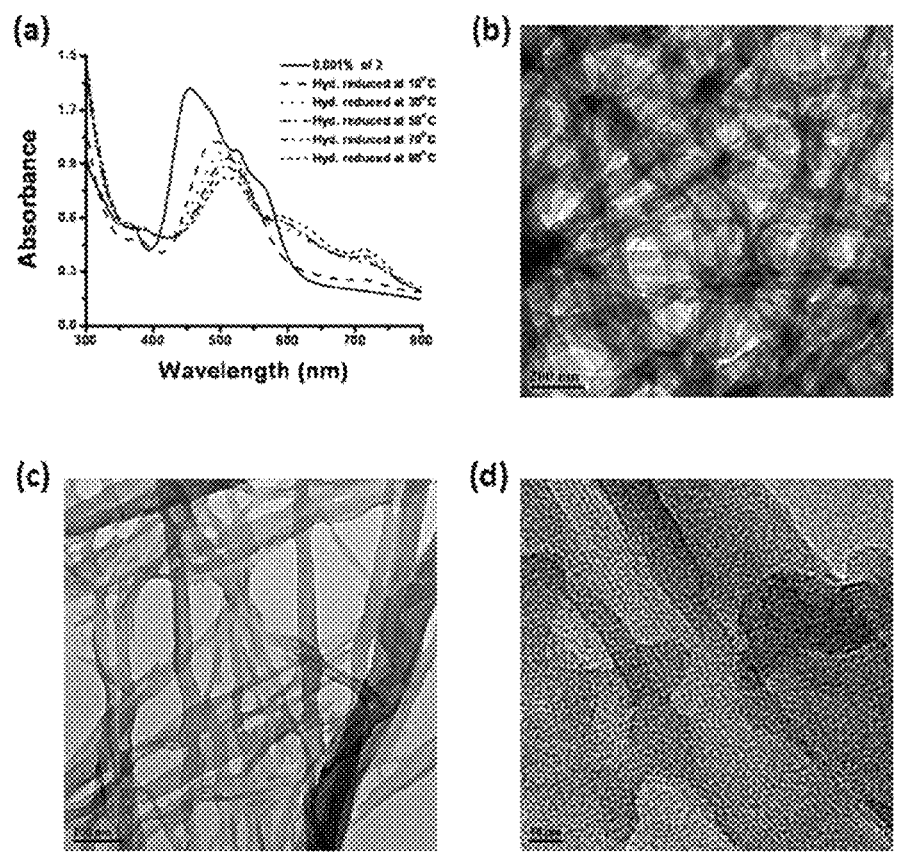
FIG. 5 depicts a) UV-vis absorption spectra of 2 as a function of temperature upon hydrazine addition, b) TEM image of 2 before, and c) after hydrazine addition, d) HRTEM image showing the lamellae in the nanowires of 2.
Figure 15:
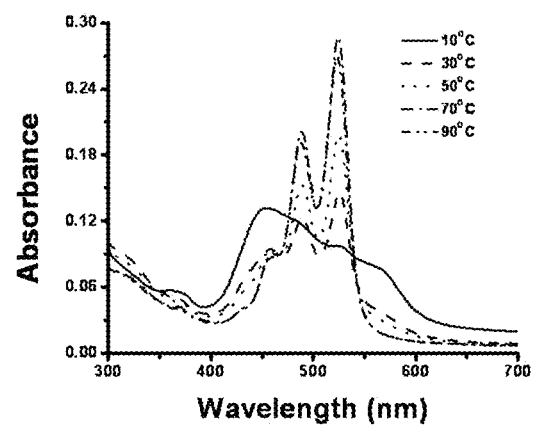
FIG. 15 depicts UV-vis absorption spectra of compound 2 as a function of temperature.
Figure 16:
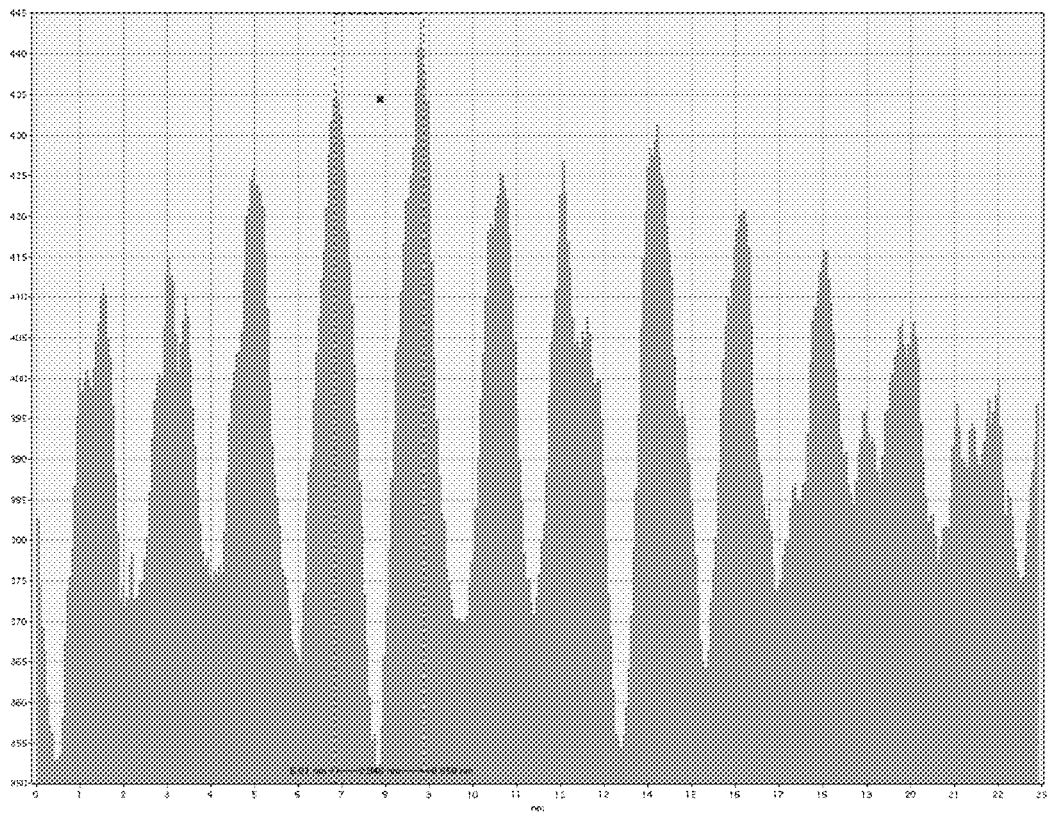
FIG. 16 depicts Scanning Electron Microscopic (SEM) images of 2 before (a) and after (b) hydrazine reduction.

The metal organic compound 2 was dispersed in DMF and UV-vis absorption spectra was recorded as a function of temperature. Peaks are observed at 450, 490 and 527 nm with a small hump at 568 nm. Upon gradual heating, the peak at 450 nm decreased to a hump and the intensity of the peaks at 490 and 527 nm increased indicating the change in aggregation type (cf, FIG. 15). Further the inventors were evaluated the effect of hydrazine on the aggregates of 2 where hydrazine was added to a solution containing 2 and UV-visible spectra were recorded at various temperatures. The peak at 450 nm disappeared and new peaks evolved at 507, 620 and 720 nm (FIG. 5a). The 720 nm peak is due to the formation of radical anions. These results indicate that compounds 1 and 2 have similar self-assembly characteristics in solution.

Scanning Electron Microscopy (SEM) and Transmission Electron Microscopy (TEM) Study To study the morphology of 1 and its stability upon addition of hydrazine, electron microscopy imaging was employed. The scanning electron microscopy (SEM) and transmission electron microscopy (TEM) image showed the presence of nanowires with diameter ranging between 70 and 100 nm (FIG. 4b). Upon addition of hydrazine, these nanowires are disintegrated to small assemblies and the same was manifested in the TEM images shown in (FIG. 4c). The disintegration of nanowires is attributed to electrostatic repulsion between the negative charges generated by hydrazine Although, the hydrazine addition damaged the nanowires, it still remains as small assemblies. The UV-vis absorption studies that showed the presence of J type aggregates upon hydrazine addition is because of the presence of these small assemblies.

Figure 17:
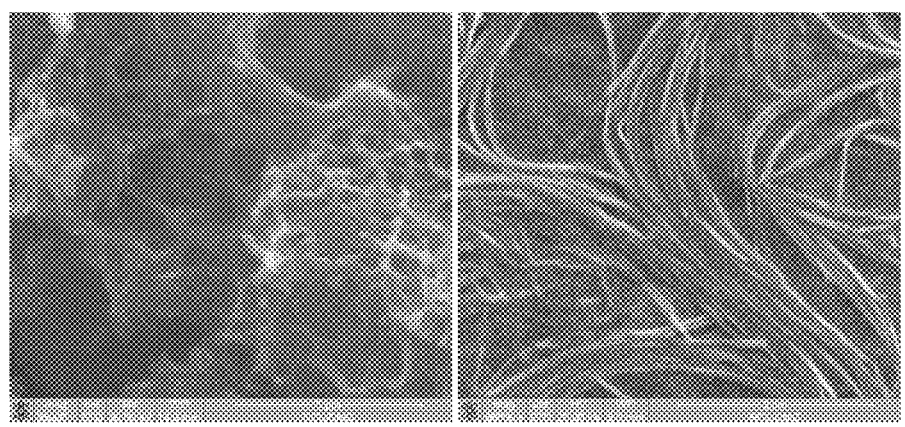
FIG. 17 depicts Lattice fringes showing the individual lamella spacing of ~2 nm (calculated for the image in FIG. 2*d*).
Figure 18:
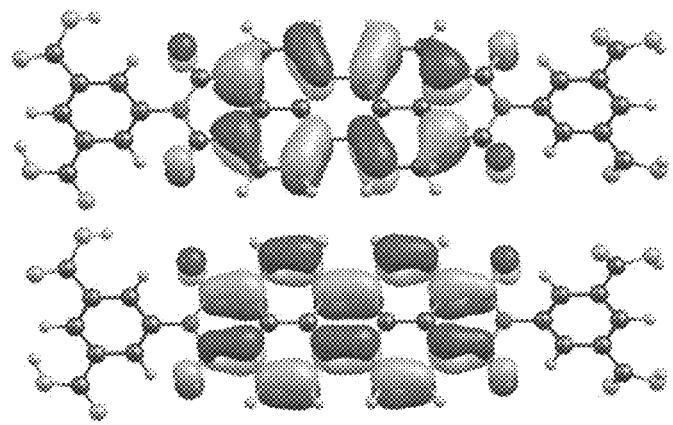
FIG. 18 depicts HOMO (a) and LUMO (b) orbital diagram of compound 1 (length of the molecule is ~2.2 nm).

SEM and TEM images of 2 were recorded before and after addition of hydrazine. The TEM images showed presence of nanowires network with individual wire diameter ranging between 70 and 100 nm (FIG. 5b). The nanowires didn't disintegrate upon addition of hydrazine (FIG. 5c). Furthermore, the nanowires were subjected to high resolution TEM (HRTEM) to identify the presence of any smaller features in the nanowires. In the HRTEM images, presence of lamellae in the nanowires of 2 was observed (FIG. 5d). The width of, individual lamella was found to be 2 nm (cf lattice fringes, FIG. 17), which is indeed the length of 1 (determined by density functional theory calculations, FIG. S18). It was concluded that the carboxylic acid functionalities of molecule 1 have been connected by the zinc ions to form the lamellae. These lamellae are likely to assist charge hopping and increase the charge carrier mobility in field effect transistors. However the lamellae were not found in the nanowires of 1.

IR Spectroscopy Study

Figure 14:
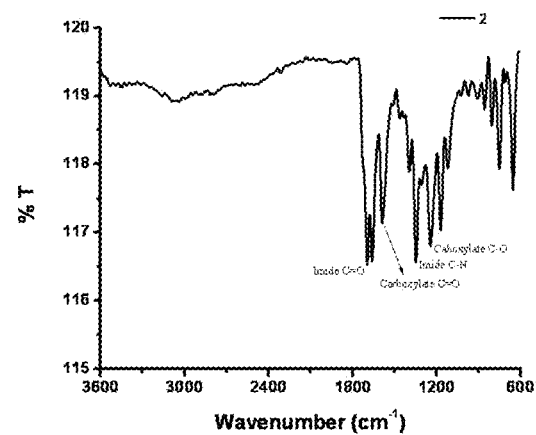
FIG. 14 depicts Fourier transform Infrared (FT-IR) spectrum of compound 2.

In order to impart integrity to the assemblies of 1, compound 2 was prepared by reacting 1 with $Zn(NO_3)_2$. IR spectroscopy was used to confirm the coordination of zinc with the carboxylic acid moieties of 1. The presence of stretching peaks at 1588 $cm^{-1}$ (C=O) and 1243 $cm^{-1}$ (C—O), which were at 1595 $cm^{-1}$ (C=O) and 1255 $cm^{-1}$ (C—O) in case of 1 indicates the formation of coordination bond between zinc and carboxylic acid functionalities.[ The disappearance of —OH (COOH moiety) stretching peak at 3410 $cm^{-1}$ in case of 2 is a further confirmation of coordination of zinc with carboxylic acid moieties (cf, FIG. 14). Inductively Coupled Plasma Atomic Emission Spectroscopy (ICP-AES) was used to further confirm the presence of zinc in 2. ICP-AES is an effective and sensitive tool to quantitatively determine the presence of metals in organic compounds. The presence of 3.54 mg/l of zinc in 2, further confirms the reaction between zinc and 1.

Ultra Violet Photoelectron Spectroscopy (UVPES) Study

Figure 6:
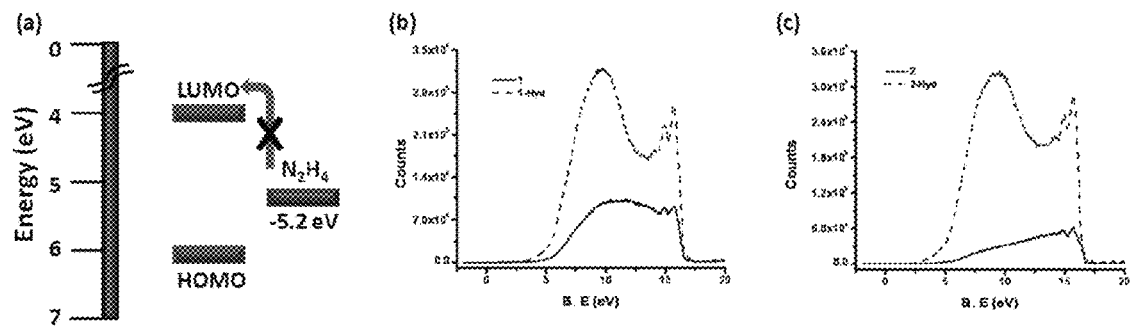
FIG. 6 depicts a) Cartoon showing the thermodynamically unfavourable electron transfer from hydrazine to the LUMO of 1 and 2, b) UVPES spectra of 1, and c) 2.
Figure 19:
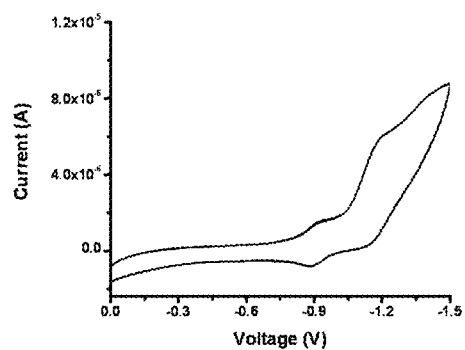
FIG. 19 depicts Cyclic vol tammogram of 1 in DMF with 0.1 M tetra butyl ammonium hexafluoro phosphate (supporting electrolyte).

In order to study the effect of hydrazine doping on the frontier orbital energy levels of 1 and 2, Ultra Violet Photoelectron Spectroscopy (UVPES) was employed. UVPES helps to determine orbital energy levels of polymers The HOMO and LUMO frontier orbital energy levels of PBI derivative 1 have been determined by cyclic voltammogram and it was found to be −6 and −4 eV, respectively (cf FIG. 19). It was well established that PBI radical anion can be generated by using hydrazine as reducing agent. The redox energy level of hydrazine is −5.2 eV. Thus, injecting an electron to the LUMO energy of PBIs by hydrazine is thermodynamically unfavourable due to high LUMO energy (FIG. 6a). However, hydrazine addition indeed reduced 1 and 2, which was confirmed by electrochemical and optical absorption studies. In UVPES, the onset of HOMO photoelectron emission was observed at a binding energy (BE) of −5.9 eV for 1 and 2 (FIGS. 6b and 6c). Upon addition of hydrazine, the HOMO energy level shifted to lower binding energy by 0.8 (1) and 1 eV (2). Indeed, a huge increase in HOMO electron emission intensity was observed after reduction with hydrazine (FIGS. 6b and 6c). The shift in HOMO to lower BE along with an increase in the electron count was due to the filling of electrons in the half/partially filled HOMO energy level and shallow acceptor states, which was at −6 eV below the redox energy level of hydrazine (−5.2 eV). Upon electron filling this energy level was destabilised to −5.1 and −4.9 eV for 1 and 2, respectively. The origin of a peak at 700 nm in UV-Vis absorption spectroscopy upon hydrazine reduction (FIG. 5a) and above UVPES results were consistent and reiterate the band gap modulation. Furthermore, the above HOMO destabilization (from UVPES) could be incorporated by subtracting 1 eV from the electrochemically determined HOMO, which makes the energy level of 2 at −5 eV.

Fabrication of OFET Devices

Figure 7:
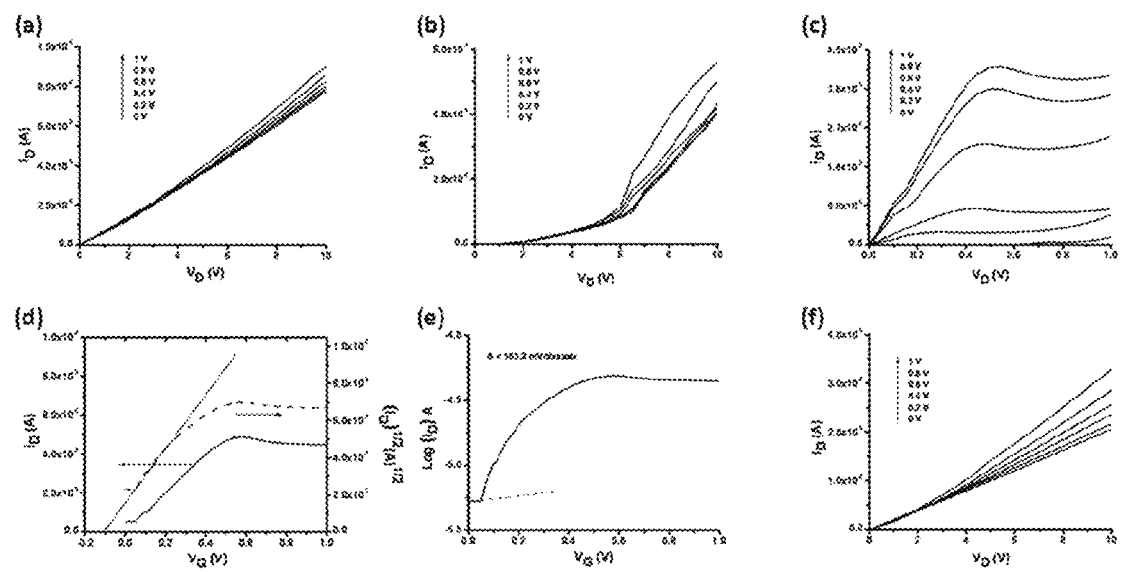
FIG. 7 depict s a) Output characteristic IV curves of 1, b) 2, and c) 2 after hydrazine doping, d) Transfer characteristic IV curve of hydrazine doped 2, e) The plot showing the calculation of sub threshold slope for hydrazine doped 2, f) Output characteristic IV curve of hydrazine doped 2 after 150 h of exposure to ambient conditions.

With understanding of orbital energy levels and self assembly properties of 1 and 2 in solution and solid state, the inventors proceeded to fabricate OFET devices. The prefabricated OFET substrates were coated with 1 from a DMF solution. The output characteristic IV measurements were carried out by sweeping the drain voltage (VD) between 0 and 10 V while holding the gate voltage (VG) constant. The output characteristics showed only linear regimes, with very little change in ID as a function of VG (FIG. 7a). The charge carrier mobility ($\mu$)) was calculated in the linear regime and was found to be $8 \times 10^{-3}$ cm2/Vs. Other device metrics are summarised in Table 1, herein below. The device was then treated with hydrazine to generate radical anions, and measurement of IV curves was attempted. Reliable IV curves could not be obtained, presumably due the disintegration of nanowires upon addition of hydrazine. These small assemblies were not suffice to connect the source and drain electrodes, which hinders the IV measurement. Further OFET performance of 2 was studied by following the procedure employed for compound 1. The output characteristic IV curves exhibited linear regimes and indistinguishable saturation regimes, while sweeping the VD between 0 and 10 V (FIG. 7b). On the other hand well defined linear and saturation regimes were observed for the hydrazine treated or doped devices of 2. Interestingly, while sweeping the VD between 0 and 1 V, a profound increase in ID was observed as a function of increasing VG (FIG. 7c). The low operating voltage is due to the presence of radical anion in doped 2, Further the ($\mu$) and VT were calculated to be 13 cm2/Vs and −0.1 V, respectively (FIG. 7d). The low operating voltage and threshold voltage (VT) should result in low sub threshold slope (S). which is the voltage swing 0.20 required to switch the transistor "on" from "off" state and hence a low S is desirable. The S for the hydrazine reduced 2 was found to be 0.16 V/dec (FIG. 7e) that is 60% lower than that observed for a device fabricated using undoped 2. In fact, this is significantly lower than the other radical containing semiconductor based device Environmental Stability Study In order to study the environmental stability of the device, the inventors measured the device metrics at various time intervals. There was no change in device efficiency over a period of 24 h, while the device was exposed to atmospheric conditions. One order decrease in ($\mu$) was observed while measured at 150 h (Table 1). After this, the device's output characteristics resemble the undoped devices fabricated using 1 and 2 (FIG. 7f).

Mechanism of Charge Transport Using Au Electrodes

Figure 8:
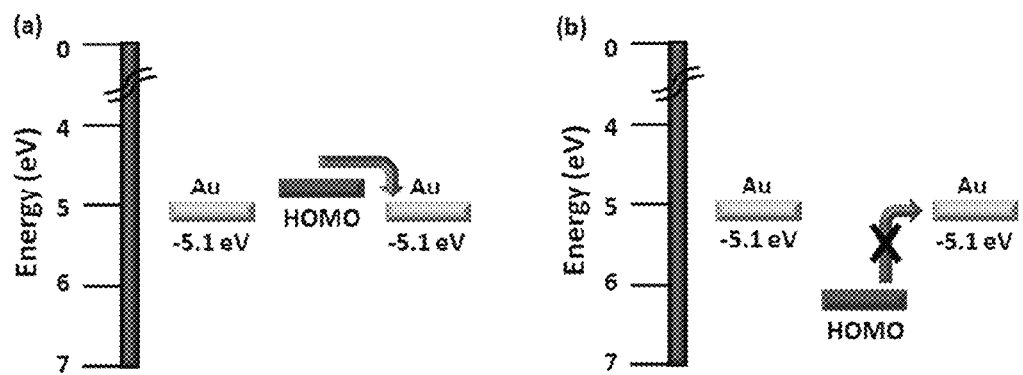
FIG. 8 depicts a) Cartoon showing the mechanism of charge transport in hydrazine doped 2 while using Au source and drain electrodes, b) Cartoon showing the energy level mismatch in case of undoped 1 and 2 with Au source and drain electrodes.
Figure 20:
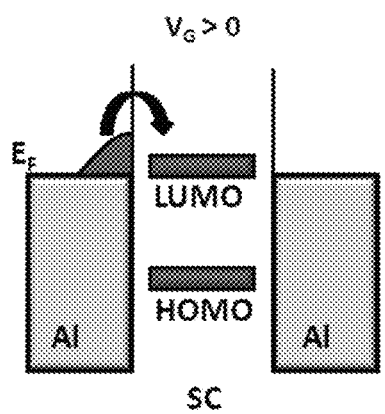
FIG. 20 depicts Operating principles of n-type field effect transistor device.

It is observed that the devices fabricated with doped 2 behave differently compared to others which is demonstrated by the work function of Au (source and drain electrode), the position of oxygen energy level and HOMO orbital energy level of the semiconductors The work function of Au is −5.1 eV[10], which is commensurate with the destabilised HOMO orbital energy of doped 2 (−5 eV). Because of this energy level match, upon application of positive drain voltage, the device works like n-type transistor and exhibit excellent efficiency (FIG. 8a). On the other hand, undoped 1 and 2 have their HOMO energy level well below (1 eV) the work function of Au. This energy level mismatch is the likely reason for the anomalous device behaviour (FIG. 8b). Further a device that showed typical OFET behaviour with impressive device parameters transpire to show at typical device behaviour. It is necessary to recall that the oxygen energy level is at −5.2 eV, which is lower than the destabilised. HOMO orbital energy (−5 eV) level of 2. In such energy level offset, the electrons in the orbitals at −5 eV are vulnerable to oxidation. Therefore, the prolonged exposure of hydrazine doped 2 to atmospheric oxygen result in the formation of neutral 2. The neutral 2 based device characteristics resembles the devices fabricated using undoped 1 and 2 because of the absence radical anions and the energy level mismatch thereby, the increase in operation voltage should increase the sub threshold slope as well. Indeed, the sub threshold slope was found to be 4.4 V/dec for the device that was fabricated using doped 2 and exposed to ambient condition over a period of 150 h. This further corroborates that the improvement in device efficiency is related to the radical anion generated by injecting an electron to the HOMO frontier orbital energy level of 2, however usually the electron transport occur in the LUMO energy level of the semiconductor and the electrodes with commensurate work function (Al) are used, (cf FIG. 20). In the instant invention Au electrodes are used due to the transport of electrons in the HOMO, which has commensurate orbital energy with Au.

TABLE 1

Organic Field Effect Transistor Metrics for 1 and 2

| Compound | $V_T$ (V) | $\mu$ (cm$^2$/Vs) | S (mV/dec) | $I_{on}/I_{off}$ |
|---|---|---|---|---|
| 1 | — | $8 \times 10^{-3[a]}$ | — | 1 |
| 1 + Hyd | — | — | — | — |
| 2 | 0.3 | $0.13^{[a]}$ | 276 | 10 |
| 2 + Hyd | −0.1 | 13 | 163 | 40 |
| 2 + Hyd (48 h) | −0.1 | 2.5 | — | 30 |
| 2 + Hyd (96 h) | 0.3 | 2.7 | 245 | 30 |
| 2 + Hyd (150 h) | −0.3 | 1.2 | 4405 | 1 |

Thus the instant invention provides stable metal organic nanowires comprising zinc metal and PBI with four carboxylic acid moieties, with ~2 nm lamellae in it. These lamellae containing nanowires are stable upon doping by hydrazine. The hydrazine injects electrons to the partially filled HOMO energy levels and generates intermediate energy levels that are commensurate with the work function of source and drain electrodes (Au). The OFET device operates at a voltage of 1 V and exhibits electron mobility as high as 13 cm$^2$/Vs in atmospheric condition. The threshold voltage and sub threshold slope were found to be −0.1 V and 0.16 V/dec, respectively. The device efficiency is improved by doping and concurrent generation of radical anions in the PBIs. This demonstration of injecting electrons to the HOMO, opens up new avenues for the fabrication of efficient organic field effect transistors with a possibility for commercial exploration.

EXAMPLES

The following examples are given by way of illustration therefore should not be construed to limit the scope of the invention.

Example 1

Synthesis of N,N'-Di-(phenyl-3,5-dicarboxylic acid)-perylene-3,4,9,10-tetracarboxylic acid diimide ligand (1): PTCDI-Tetracraboxylic acid A mixture of 0.500 g (1.274 mmol) of 3,4,9,10-perylene tetracarboxylic dianhydride, 0.694 g (3.823 mmol) of 5-amino isophthalic acid, 20 g of imidazole and 0.100 g (0.456 mmol) of zinc acetate was heated at 150° C. for 20 h under argon atmosphere. Mixture was cooled and 100 ml of 2N hydrochloric acid was added for precipitation of product. The precipitate was collected by vacuum filtration and washed with a mixture of methanol and water. The product 1 was dried at 100° C. for 12 h.

1H NMR of PTCDI (400 MHz; D2O, 25° C.). δ (ppm)= 8.43 (s, 2H), 8.35 (s, 4H), 8.02 (m, 8H)

IR (KBr) ν max=743, 808, 851, 1118, 1251, 1353, 1573, 1596, 1664, 1698, 2974, 3154, 3410 cm-1.

Example 2

Complexation of Ligand with Zn(II) Ion (2)

Zinc nitrate hexahydrate (0.087 g, 0.291 mmol) and 1 (0.060 g, 0.081 mmol) were dissolved in DMF/1,4-Dioxane/H$_2$O Ratio 3:1:1 in Teflon liner. The reaction mixture was heated in oven at 100° C. for 3 Days. The reaction vessel was then removed from the oven and allowed to cool to room temperature. Product was washed with DMF, methanol and chloroform.

IR (KBr) ν max=751, 806, 853, 1119, 1243, 1346, 1589, 1660, 1697, 2984 cm-1.

Example 3

Microcrystalline Metal Coordinated Assembled Material (2)

A mixture of 0.500 g (1.274 mmol) of 3,4,9,10-perylene tetracarboxylic dianhydride, 0.694 g (3.823 mmol) of 5-amino isophthalic acid, 20 g of imidazole and 0.100 g (0.456 mmol) of zinc acetate was heated at 150° C. for 20 h under argon atmosphere. Mixture was cooled and 100 ml of 2N hydrochloric acid was added for precipitation of product. The precipitate was collected by vacuum filtration and washed with a mixture of methanol and water. The product PTCDI-TC 1 was dried at 100° C. for 12 h, The product 1 was then reacted with zinc nitrate to form the metal coordinated assembled structure 2, wherein zinc nitrate hexahydrate (0.087 g, 0.291 mmol) and PTCDI-TC (1) (0.060 g, 0.081 mmol) were dissolved in DMF/1,4-Dioxane/H$_2$O Ratio 2:1:1 in Teflon liner. The reaction mixture was heated in an oven at 100° C. for 3 Days. The reaction vessel was then removed from the oven and allowed to cool to room temperature. Microcrystalline material was obtained, it was repeatedly washed with DMF and anhydrous chloroform.

Example 4

Doped Metal Organic Material

The structures obtained from example 3 were dropped on top of field effect transistors to measure the mobility. Hydrazine hydrate was used to make the molecule charge neutral. The output transfer characteristics are shown in FIG. 2. The transfer characteristics are shown in FIG. 3. The data to note are (i) The device works at a very low operating voltage (1 V), (ii) very low threshold voltage (−0.1 V), (iii) the n type (electron) mobility is measured at atmospheric condition.

Example 5

Device Fabrication

The Field effect transistor devices were fabricated by drop casting the DMF solution of 1 and 2 on prefabricated transistor electrodes which is made up of heavily n-doped silicon as a gate and $SiO_2$ as an insulating layer (capacitance—14 $nF/cm^2$). Thirty nanometer thick gold source and drain electrodes were used. The length and width of the channel are 20 µm and 10 mm, respectively. The electrodes were cleaned thoroughly with acetone and i-propanol and dried with hot air. Then the semiconducting materials (1 and 2) was drop casted on device and heated at 150° C. to evaporate the solvents, after that on the same device ~3 drops of hydrazine was added and heated at 150° C. before subjecting the device for I-V measurements. The $SiO_2$ gate oxide was not modified to provide surface —OH functionalities that would interact with the radicals of hydrazine treated 1 and 2. This interaction decrease the operating voltage and sub threshold slope. The charge carrier mobility was calculated from the saturated regime.

Example 6

Ultra Violet Photoelectron Spectroscopy Studies

UV photoelectron spectral (UVPES) studies of perylene bisimide materials were recorded with custom built ambient pressure photoelectron spectrometer (APPES) (Prevac, Poland), equipped with discharge lamp to generate different UV radiations, such as HeI or HeII with He (UVS 40A2 from Prevac), MX650 monochromator and VG Scienta's R3000HP analyser [The water cooled UV source is mounted on a CF40 flange which can give an emission current up to 100 mA for He I and 200 mA for He II]. Base pressure in the analysis chamber was maintained around $2 \times 10^{-10}$ Torr and better than $1 \times 10^{-9}$ Torr during UVPES experiments. All UVPES measurements were carried out at a pass energy of 2 eV. High-resolution core level XPS spectra of different elements were also recorded with monochromatized Al Kα with MX650.

Advantages of Instant Organic Material

The instant hydrazine doped metal linked conjugated organic molecule i.e. doped (2) exhibits high electron mobility at low applied voltage in atmospheric condition, further the synthesis of said metal complex material (2) is simple and involves inexpensive materials, the possibility of scaling up is very high.

The application of such materials can be in solar cells, transistors etc.

We claim:

1. A composition for improving the device efficiency at atmospheric condition, comprising a nano structured organic material, said nano structured organic material comprising hydrazine doped zinc (II) complex of N,N'-Di-(phenyl-3,5 dicarboxylic acid)-perylene-3,4,9,10-tetracarboxylic acid diimide, said nanostructured organic material prepared by a process comprising the steps of:
   a) reacting 3,4,9,10 perylene tetracarboxylic dianhydride with 5-amino isophthalic acid in presence of imidazole and zinc acetate at temperature range 130° C. to 160° C. for a period in the range of 15-50 hrs under argon atmosphere;
   b) precipitating the mixture of step a) in presence of 2N HCl, followed by washing with solvent selected from the group consisting of water, methanol, ethanol, propanol, isopropanol, butanol, DMF, anhydrous chloroform either alone or combination thereof and drying to obtain N,N'-Di-(phenyl-3,5 dicarboxylic acid)-perylene-3,4,9,10-tetracarboxylic acid diimide (PTCDI-TC);
   c) dissolving zinc nitrate hexahydrate and (PTCDI-TC) as obtained in step (b) in a mixture of DMF/1,4-dioxane/$H_2O$ in the ratio ranging between 1:1:1 to 3:1:1 followed by heating at temperature in the range of 100-150° C. for a period in the range of 2-6 days and subsequently cooling and washing with solvent selected from the group consisting of water, methanol, ethanol, propanol, isopropanol, butanol, DMF, anhydrous chloroform either alone or combination thereof to obtain Zn complex of PTCDI-TC; and
   d) doping the Zn complex of PTCDI-TC as obtained in step (c) with hydrazine hydrate at a temperature in the range of 100°-180° C. for a period in the range of 30-250 min.

2. The composition according to claim 1, wherein the improved device efficiency comprises charge mobility, operating voltage, threshold voltage and sub threshold slope.

3. The composition according to claim 2, wherein the charge is selected from the group consisting of electron and hole.

4. The composition according to claim 2, wherein the charge mobility is 13 $cm^2/Vs$.

5. The composition according to claim 2, wherein the operating voltage is 1 V.

6. The composition according to claim 2, wherein the threshold voltage is −0.1 V.

7. The composition according to claim 2, wherein the sub threshold slope is 0.16 V/dec.

8. The composition according to claim 1, wherein the diameter of the nano structured organic material is in the range of 70 and 100 nm.

9. The composition according to claim 1, wherein the device is organic field effect transistors (OFETs).

* * * * *